United States Patent
Chen et al.

(10) Patent No.: US 8,048,765 B2
(45) Date of Patent: Nov. 1, 2011

(54) METHOD FOR FABRICATING A MOS TRANSISTOR WITH SOURCE/WELL HETEROJUNCTION AND RELATED STRUCTURE

(75) Inventors: Xiangdong Chen, Irvine, CA (US); Bruce Chih-Chieh Shen, Irvine, CA (US); Henry Kuo-Shun Chen, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 46 days.

(21) Appl. No.: 12/583,977

(22) Filed: Aug. 28, 2009

(65) Prior Publication Data

US 2011/0049620 A1 Mar. 3, 2011

(51) Int. Cl.
   *H01L 21/76* (2006.01)

(52) U.S. Cl. ........ 438/429; 438/199; 438/286; 438/296; 438/278; 438/400; 438/426; 257/327; 257/330; 257/331; 257/332; 257/334; 257/336; 257/408; 257/488; 257/E29.118; 257/E21.639

(58) Field of Classification Search .......... None
See application file for complete search history.

(56) References Cited

U.S. PATENT DOCUMENTS

| | | | | |
|---|---|---|---|---|
| 5,517,046 | A | * | 5/1996 | Hsing et al. ............ 257/336 |
| 6,096,607 | A | * | 8/2000 | Ueno ..................... 438/268 |
| 6,159,815 | A | * | 12/2000 | Lustig et al. ........... 438/305 |
| 6,265,752 | B1 | * | 7/2001 | Liu et al. ................ 257/487 |
| 2005/0139872 | A1 | * | 6/2005 | Chidambaram et al. ... 257/288 |
| 2007/0138570 | A1 | * | 6/2007 | Chong et al. ........... 257/371 |
| 2007/0178650 | A1 | * | 8/2007 | Chen et al. ............. 438/301 |
| 2008/0237703 | A1 | * | 10/2008 | Lin et al. ............... 257/336 |

* cited by examiner

*Primary Examiner* — Charles Garber
*Assistant Examiner* — Yasser Abdelaziez
(74) *Attorney, Agent, or Firm* — Farjami & Farjami LLP

(57) ABSTRACT

According to an exemplary embodiment, a method for fabricating a MOS transistor, such as an LDMOS transistor, includes forming a gate stack over a well. The method further includes forming a recess in the well adjacent to a first sidewall of the gate stack. The method further includes forming a source region in the recess such that a heterojunction is formed between the source region and the well. The method further includes forming a drain region spaced apart from a second sidewall of the gate stack. In one embodiment, the source region can comprise silicon germanium and the well can comprise silicon. In another embodiment, the source region can comprise silicon carbide and the well can comprise silicon.

20 Claims, 7 Drawing Sheets

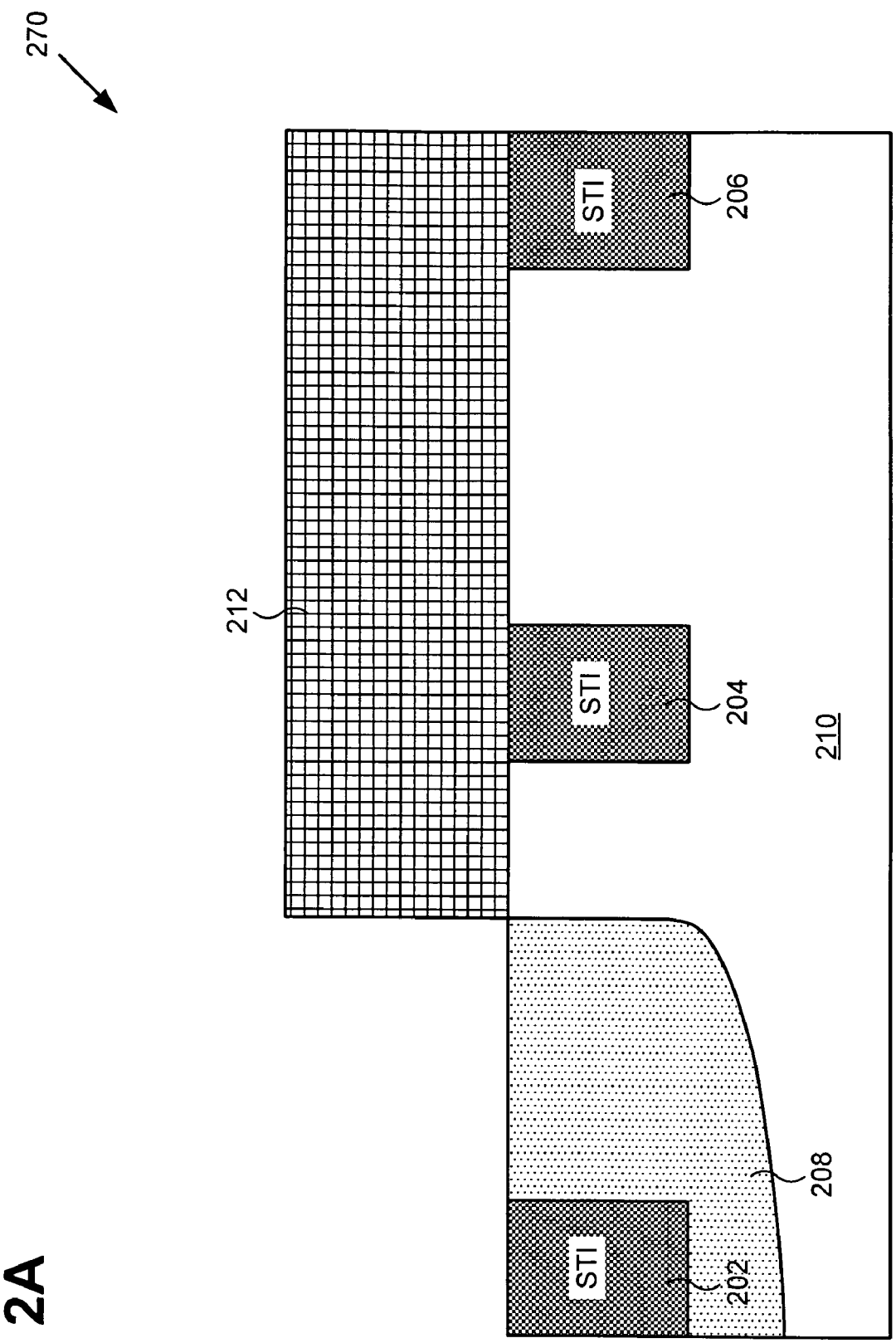

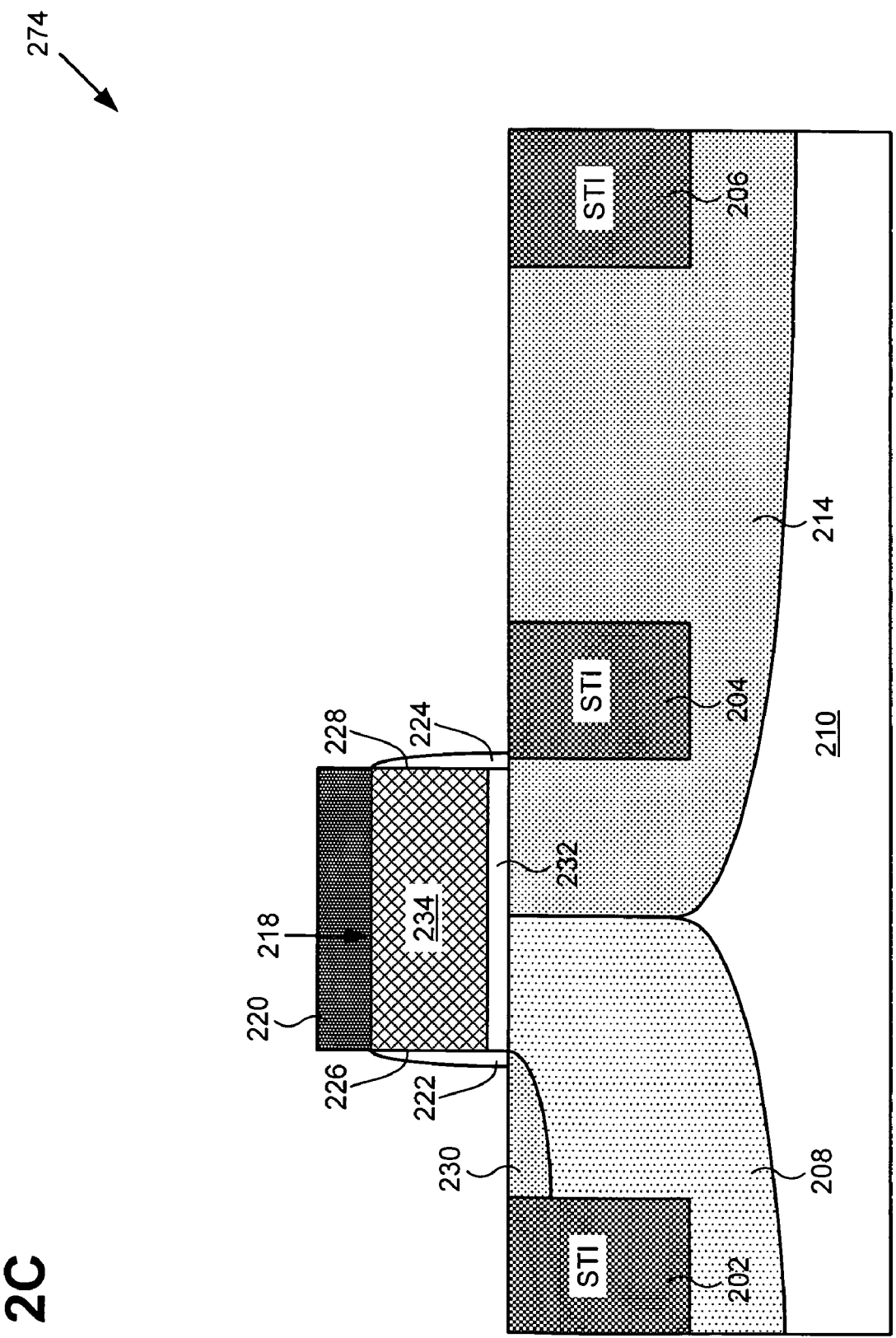

US 8,048,765 B2

METHOD FOR FABRICATING A MOS TRANSISTOR WITH SOURCE/WELL HETEROJUNCTION AND RELATED STRUCTURE

BACKGROUND OF THE INVENTION

1. Field of the Invention

The present invention generally relates to the field of semiconductors. More particularly, the invention relates to transistor semiconductor structures.

2. Background Art

MOS (Metal Oxide Semiconductor) transistors, such as Lateral Diffusion Metal Oxide Semiconductor (LDMOS) transistors, can be utilized as power transistors in high voltage switches and power amplifiers in cell phones and other wireless communication devices, as well as other types of applications that require a high power transistor. A MOS transistor, such as an LDMOS transistor, is generally utilized to provide an increased breakdown voltage. However, when utilized as a switching device, it is desirable for a MOS transistor, such as an LDMOS transistor, to have a low on-resistance (Rdson), which refers to the source-to-drain resistance of the transistor when it is turned on.

Conventionally, an increased breakdown voltage can be achieved in a MOS transistor, such as an LDMOS transistor, by increasing the drift region between channel and drain. However, increasing the drift region between channel and drain can cause the on-resistance of the MOS transistor, such as an LDMOS transistor, to increase, which is undesirable. Thus, in a conventional MOS transistor, such as a conventional LDMOS transistor, it is difficult to achieve both an increased breakdown voltage and a reduced on-resistance.

SUMMARY OF THE INVENTION

Method for fabricating a MOS transistor with source/well heterojunction and related structure, substantially as shown in and/or described in connection with at least one of the figures, as set forth more completely in the claims.

BRIEF DESCRIPTION OF THE DRAWINGS

FIG. 2A illustrates a cross-sectional view, which includes a portion of a wafer processed according to an embodiment of the invention, corresponding to an initial step in the flowchart in FIG. 1.

FIG. 2C illustrates a cross-sectional view, which includes a portion of a wafer processed according to an embodiment of the invention, corresponding to an intermediate step in the flowchart in FIG. 1.

DETAILED DESCRIPTION OF THE INVENTION

The present invention is directed to a method for fabricating a MOS transistor with source/well heterojunction and related structure. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
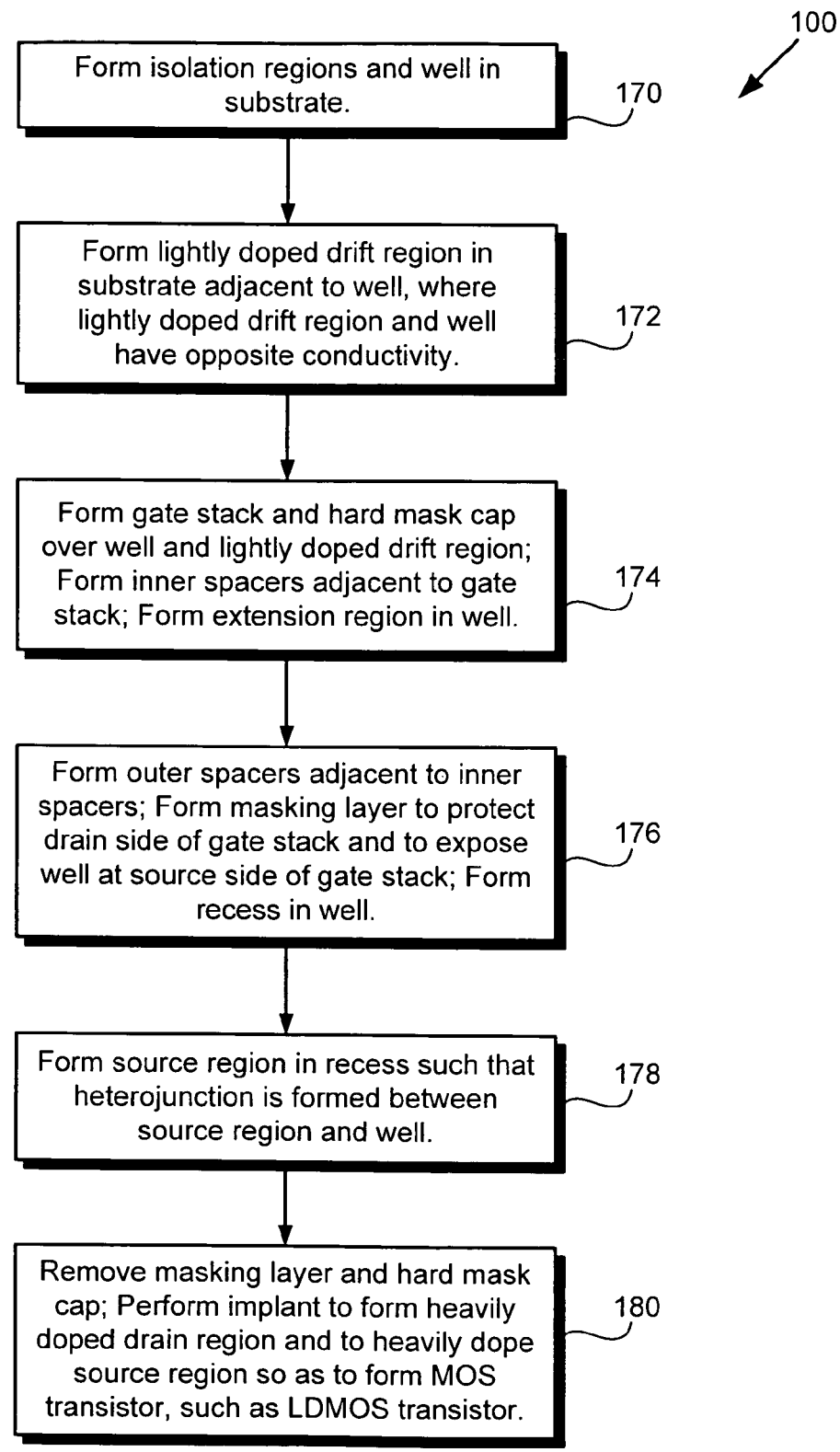
FIG. 1 shows a flowchart illustrating the steps taken to implement an embodiment of the present invention.

FIG. 1 shows a flow chart illustrating a method according to an embodiment of the present invention. Certain details and features have been left out of flowchart 100 that are apparent to a person of ordinary skill in the art. For example, a step may consist of one or more substeps or may involve specialized equipment or materials, as known in the art. Steps 170 through 180 indicated in flowchart 100 are sufficient to describe one embodiment of the present invention; however, other embodiments of the invention may utilize steps different from those shown in flowchart 100. It is noted that the processing steps shown in flowchart 100 are performed on a portion of wafer, which, prior to step 170, includes, among other things, a substrate, such as a silicon substrate. The wafer is also referred to as a semiconductor die or simply a die in the present application.

Moreover, structures 270 through 280 in FIGS. 2A through 2F illustrate the result of performing steps 170 through 180 of flowchart 100, respectively. For example, structure 270 shows a semiconductor structure after processing step 170, structure 272 shows structure 270 after the processing of step 172, structure 274 shows structure 272 after the processing of step 174, and so forth.

Referring now to step 170 in FIG. 1 and structure 270 in FIG. 2A, at step 170 of flowchart 100, isolation regions 202, 204, and 206 and well 208 are formed in substrate 210. As shown in FIG. 2A, isolation regions 202, 204, and 206 are situated in substrate 210, which can be, for example, a P type substrate, such as a P type silicon substrate. Isolation regions 202, 204, and 206 can be, for example, shallow trench isolation (STI) regions and can comprise silicon oxide or other dielectric material. Also shown in FIG. 2A, well 208 is situated in substrate 210 and mask 212 is situated over isolation regions 204 and 206 and substrate 204. Well 208 can be, for example, an N type well (N well). In one embodiment, well 208 can be a P type well (P well). Mask 212 can comprise a masking material, such as photoresist, and can be formed by depositing a layer of masking material and patterning the masking material so as to expose a portion of substrate 210 in which to form well 208. Well 208 can be formed by appropriately doping the exposed portion of substrate 210 with, for example, an N type dopant. In one embodiment, well 208 can be formed by utilizing a P type dopant. After formation of well 208, mask 212 can be removed in an etch process, such as a wet etch process. The result of step 170 of flowchart 100 is illustrated by structure 270 in FIG. 2A.

Figure 2B:
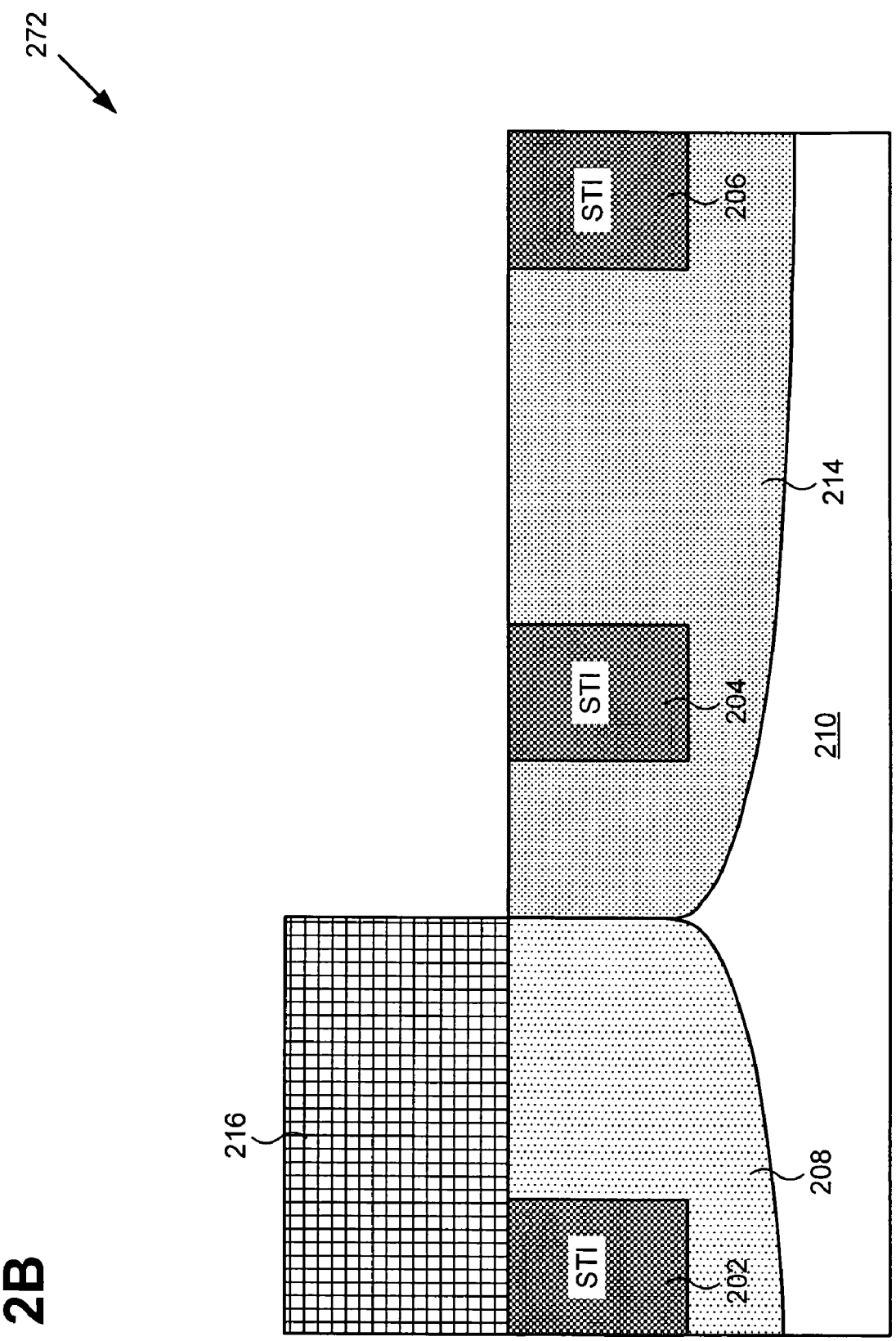
FIG. 2B illustrates a cross-sectional view, which includes a portion of a wafer processed according to an embodiment of the invention, corresponding to an intermediate step in the flowchart in FIG. 1.

Referring to step 172 in FIG. 1 and structure 272 in FIG. 2B, at step 172 of flowchart 100, lightly doped drift region 214 (also referred to simply as "drift region 214" in the present application) is formed in substrate 210 adjacent to well 208, where drift region 214 and well 208 having opposite conductivity. As shown in FIG. 2B, drift region 214 is situated in substrate 210 adjacent to well 208 and mask 216 is situated over well 208. Drift region 214 can be, for example, a lightly doped P type drift region. In one embodiment, drift region 220 can be a lightly doped N type drift region. Drift region 214 and well 208 have an opposite conductivity. Thus, in an embodiment in which well 208 is an N well, drift region 214 is a P type drift region, and vice versa. Mask 216 can comprise a masking material, such as photoresist, and can be formed by depositing a layer of masking material and patterning the masking material so as to expose a portion of substrate 210 in which to form drift region 214 while protecting well 208 from the dopant utilized to form drift region 214. After drift region 214 has been formed, mask 216 can be removed in an etch process, such as a wet etch process. The result of step 172 of flowchart 100 is illustrated by structure 272 in FIG. 2B.

Referring to step 174 in FIG. 1 and structure 274 in FIG. 2C, at step 174 of flowchart 100, gate stack 218 and hard mask cap 220 are formed over well 208 and drift region 214, inner spacers 222 and 224 are formed adjacent to respective sidewalls 226 and 228 of gate stack 218, and extension region 230 is formed in well 208. As shown in FIG. 2C, gate stack 218 includes gate insulator 232, which is situated well 208 and drift region 214, and gate 234, which is situated over gate insulator 232. Gate insulator 232 can comprise, for example, silicon oxide, silicon oxynitride, a high dielectric constant (high-k) dielectric material, or other suitable dielectric material. Gate stack 218 can comprise, for example, polycrystalline silicon (polysilicon) or a metal. Also shown in FIG. 2C, hard mask cap 220 is situated over gate stack 218 and protects the gate stack during subsequent processing steps. Hard mask cap 220 can comprise silicon nitride or other hard mask material.

Gate stack 234 and hard mask cap 220 can be formed, for example, by depositing layer of dielectric material, such as silicon oxide, over well 208 and drift region 214, depositing a layer of polysilicon over the layer of dielectric material, and depositing a layer of hard mask material, such as silicon nitride, over the layer of polysilicon by utilizing a chemical vapor deposition (CVD) process or other suitable deposition processes. The layers of dielectric material, polysilicon, and hard mask material can then be etched in a gate etch process as is known in the art. Further shown in FIG. 2C, inner spacers 222 and 224 are situated adjacent to respective sidewalls 226 and 228 of gate stack 218. Inner spacers 222 and 224 can comprise a dielectric material, such as, for example, silicon oxide or silicon nitride. Inner spacers 222 and 224 can be formed, for example, by conformally deposited a layer of dielectric material, such silicon oxide, over gate stack 234 and hard mask cap 220, and etching the layer of dielectric material in a spacer etch process. During the formation of inner spacers 222 and 224, the dielectric material is removed from hard mask cap 220.

Also shown in FIG. 2C, extension region 230 is situated in well 208 adjacent to sidewall 226 of gate stack 218. Extension region 230 is a lightly doped region having an opposite conductivity as well 208. Thus, in an embodiment in which well 208 is an N well, extension region 230 can be a P type extension region, and in an embodiment in which well 208 is a P well, extension region 230 can be an N type extension region. Extension region 230 can be formed by utilizing an appropriate dopant implantation process. In one embodiment, a halo implanted region (not shown in FIG. 2C) can be formed adjacent to extension region 230 and underlying gate stack 218. The halo implanted region can have an opposite conductivity as extension region 230 and can be formed by utilizing a halo implantation process as is known in the art. The result of step 174 of flowchart 100 is illustrated by structure 274 in FIG. 2C.

Figure 2D:
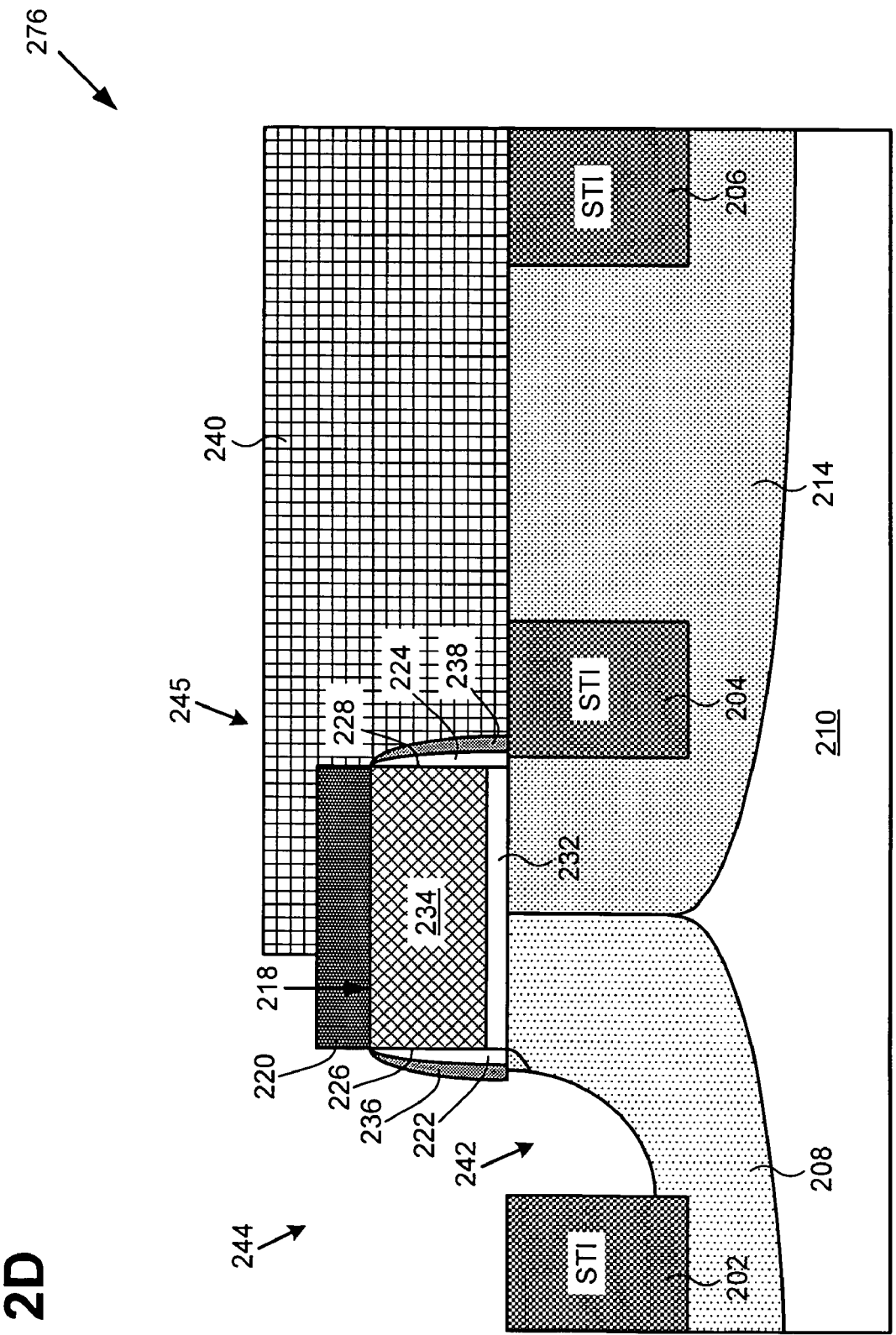
FIG. 2D illustrates a cross-sectional view, which includes a portion of a wafer processed according to an embodiment of the invention, corresponding to an intermediate step in the flowchart in FIG. 1.

Referring to step 176 in FIG. 1 and structure 276 in FIG. 2D, at step 176 of flowchart 100, outer spacers 236 and 238 are formed adjacent to respective inner spacers 222 and 224, masking layer 240 is formed to protect drain side 245 of gate stack 218 and to expose well 208 at source side 244 of gate stack 218, and recess 242 is formed in well 208. As shown in FIG. 2D, outer spacers 236 and 238 are situated adjacent to respective inner spacers 222 and 224 and can comprise, for example, silicon nitride or other suitable dielectric material. Outer spacers 236 and 238 can be formed, for example, by conformally depositing a layer of silicon nitride over inner spacers 222 and 224 and hard mask cap 220 by utilizing a CVD process or other deposition process and etching back the layer of silicon nitride in a spacer etch process.

Also shown in FIG. 2D, masking layer 240 is situated over a portion of hard mask cap 220, outer spacer 238, isolation regions 204 and 206, and drift region 214 such that well 208 is exposed at source side 244 of gate stack 218 and recess 242 is situated in well 208. Masking layer 240 can comprise, for example, silicon oxide or other masking material. Masking layer 240 can be formed, for example, by depositing a layer of silicon oxide over hard mask cap 220, outer spacers 236 and 238, isolation regions 202, 204, and 206, well 208, and drift region 214 by utilizing a CVD process or other deposition process and appropriately patterning the layer of silicon oxide to protect drain side 245 of gate stack 218 and to expose well 208 at source side 244 of gate stack 218. Further shown in FIG. 2D, recess 242 is situated in well 208 and can be formed, for example, by utilizing an etch process, such as a wet etch process, to remove a semiconductor material (i.e. silicon) in well 208 adjacent to sidewall 226 of gate stack 218. During the etch process, gate stack 218 is protected by outer spacer 236 and hard mask cap 220. In an embodiment of the invention, a small undercut can be formed under outer spacer 236 during the etch process that is utilized to form recess 242. The result of step 176 of flowchart 100 is illustrated by structure 276 in FIG. 2D.

Figure 2E:
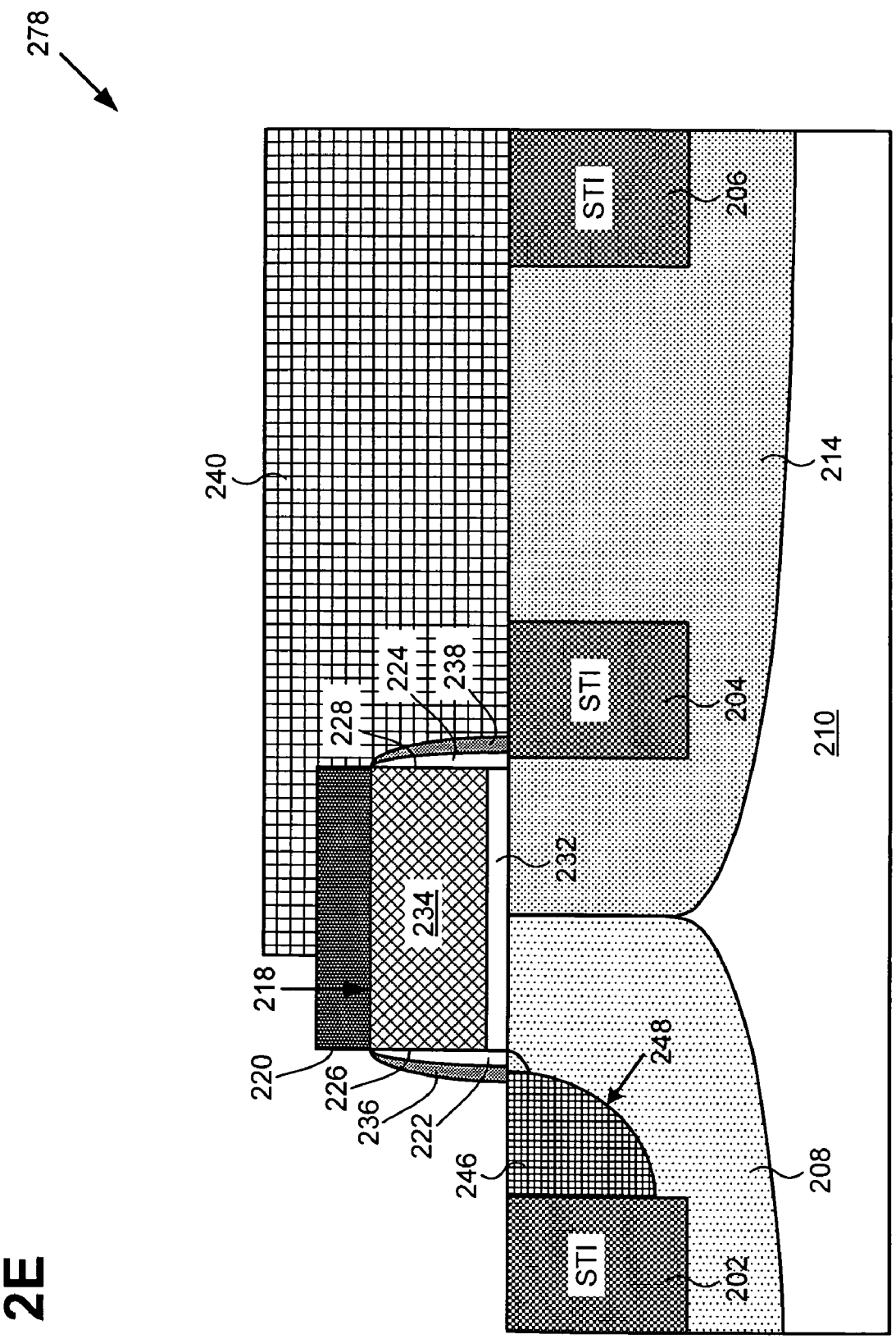
FIG. 2E illustrates a cross-sectional view, which includes a portion of a wafer processed according to an embodiment of the invention, corresponding to an intermediate step in the flowchart in FIG. 1.

Referring to step 178 in FIG. 1 and structure 278 in FIG. 2E, at step 178 of flowchart 100, source region 246 is formed in recess 242 (shown in FIG. 2D) such that heterojunction 248 is formed between source region 246 and well 208. Source region 246 can comprise a semiconductor material having a different lattice structure compared to the lattice structure of silicon (i.e. the semiconductor material in well 208) so as to form heterojunction 248. In one embodiment, source region 246 can comprise silicon germanium (SiGe), which can have larger lattice structure than silicon. In another embodiment, source region 246 can comprise silicon carbide (SiC), which can also have a larger lattice structure than silicon. Source region 246 can be formed, for example, by utilizing an epitaxial process to grow silicon germanium in recess 242 (shown in FIG. 2D). In one embodiment, source region 246 can be formed by heavily doping silicon germanium in situ during the epitaxial process, where source region 246 has an opposite conductivity as well 208. For example, in an embodiment in which well 208 is an N well, source region 246 can be a heavily doped P type source region comprising silicon germanium. In one embodiment, source region 246 can be formed, for example, by utilizing an epitaxial process to grow silicon carbide in recess 242. The result of step 178 of flowchart 100 is illustrated by structure 278 in FIG. 2E.

Figure 2F:
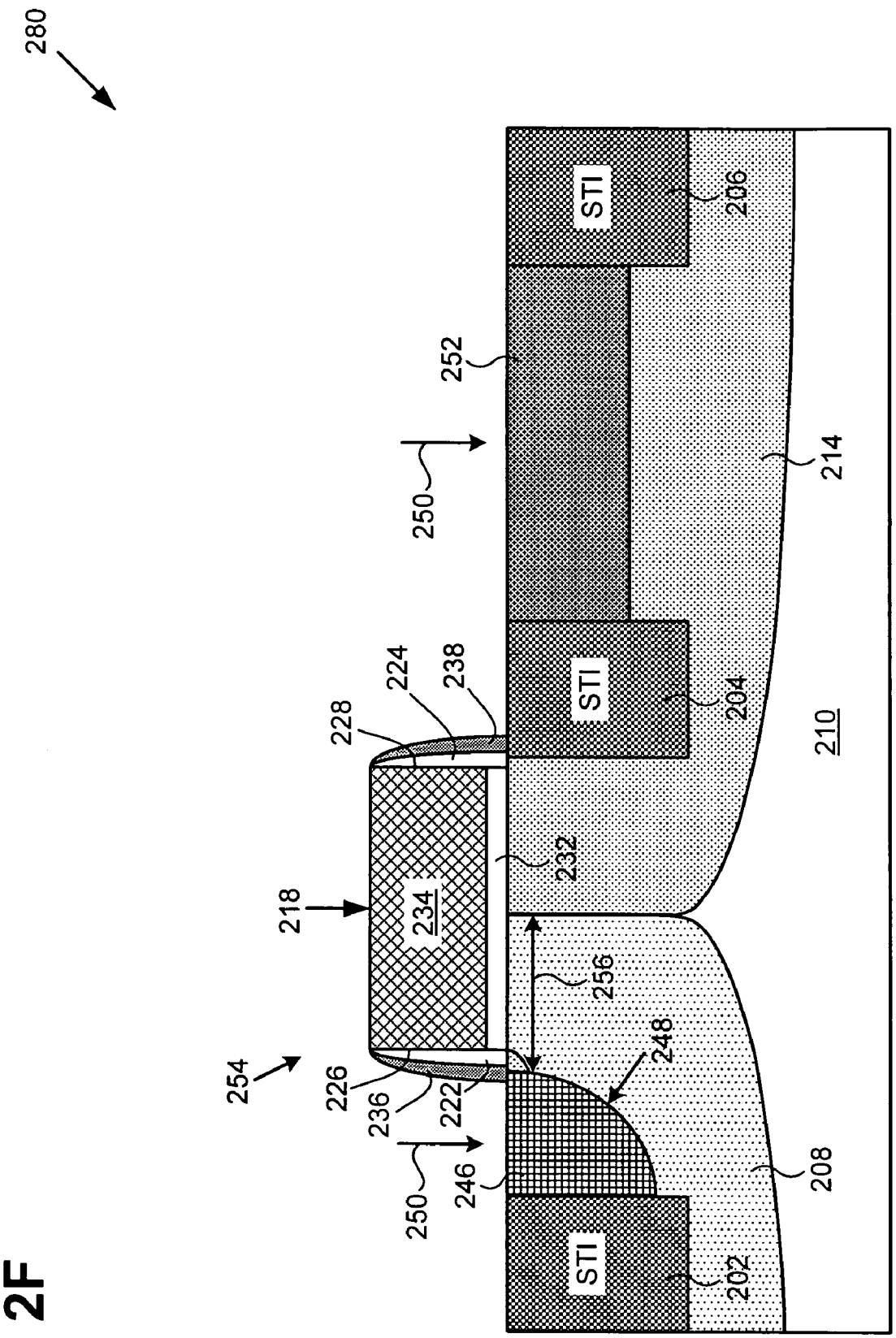
FIG. 2F illustrates a cross-sectional view, which includes a portion of a wafer processed according to an embodiment of the invention, corresponding to final step in the flowchart in FIG. 1.

Referring to step 180 in FIG. 1 and structure 280 in FIG. 2F, at step 180 of flowchart 100, masking layer 240 (shown in FIGS. 2D and 2E) and hard mask cap 220 (shown in FIGS. 2C, 2D, and 2E) are removed and implant 250 is performed to form heavily doped drain region 252 and to heavily dope source region 246, thereby forming MOS transistor 254, such as an LDMOS transistor. In an embodiment in which source region 246 has been heavily doped in situ in a previous processing step, implant 250 is not performed in source region 246. In such embodiment, source region 246 can be protected by a mask. Masking layer 240 (shown in FIGS. 2D and 2E) and hard mask cap 220 (shown in FIGS. 2C, 2D, and 2E) can be removed, for example, by utilizing a wet etch process or other suitable etch process.

As shown in FIG. 2F, drain region 252, which is a heavily doped drain region, is situated between isolation regions 204 and 206 in drift region 214 and is spaced apart from sidewall 228 of gate stack 218. In an embodiment of the invention, drain region 252 is laterally separated from sidewall 228 of gate stack 218 by isolation region 204. In contrast, source region 246 is situated adjacent to sidewall 226 of gate stack 218. Drain region 252 can be formed, for example, by utilizing implant 250 to implant a heavy dose of a suitable dopant in a portion of drift region 214 situated between isolation regions 204 and 206, such that drain region 252 has a same conductivity as drift region 214. In one embodiment of the invention, drain region 252 can be a heavily doped P type drain region. In another embodiment, drain region 252 can be a heavily doped N type drain region.

As shown in FIG. 2F, MOS transistor 254, such as an LDMOS transistor, is situated over substrate 210 and includes gate stack 218, inner sidewalls 222 and 224, outer side walls 236 and 238, source region 246, drain region 252, and channel 256, which is formed under gate stack 218 between source region 248 and drift region 214. Thus, drain region 252, which is a heavily doped drain region, is separated from channel 256 by drift region 214, which is a lightly doped drift region, and isolation region 204. As also shown in FIG. 2F, heterojunction 248, which is formed between source region 246 and well 208 as a result of the different semiconductor materials situated in source region 246 and well 208, can form a higher barrier between source region 246 and channel 256. By forming a higher barrier between source region 246 and channel 256, heterojunction 248 can increase breakdown voltage so as to improve source region-to-drift region punchthrough in MOS transistor 254, such as an LDMOS transistor, in an embodiment of the invention.

MOS transistor 254 can be a PMOS transistor, such as a P type LDMOS transistor or an NMOS transistor, such as an N type LDMOS transistor, and source region 246 can comprise silicon germanium or silicon carbide. In an embodiment in which MOS transistor 254 is a PMOS transistor, such as a P type LDMOS transistor, and source region 246 comprises silicon germanium, heterojunction 248, which is formed between source region 246 and well 208, provides an increased barrier between source region 246 and channel 256. As a result, breakdown voltage is increased so as to advantageously improve punchthrough between source region 246 and drift region 214. Also, silicon germanium in source region 246 can induce compressive strain in channel 256, thereby increasing carrier mobility (i.e. hole mobility) and, consequently, advantageously reducing the on-resistance (Rdson) of MOS transistor 254, which is the resistance between source region 246 and drain region 252 when MOS transistor 254 is turned on. In such embodiment, drift region 214, which is a P type drift region, and drain region 252, which is a P type drain region, do not comprise silicon germanium.

In an embodiment in which MOS transistor 254 is an NMOS transistor, such as an N type LDMOS transistor, and source region 246 comprises silicon germanium, heterojunction 248, which is formed between source region 246 and well 208, facilitates hot hole injection into source region 246 so as to reduce substrate current (i.e. current flowing from channel 256 into substrate 210) and also reduce the hot carrier effect. The hot carrier effect refers to the injection of electrons into gate insulator 232 and the injection of holes into the body (i.e. substrate 210). The injection of electrons into gate insulator 232 can break down gate oxide, thereby reducing the reliability of MOS transistor 254, such as an LDMOS transistor. Thus, by reducing the hot carrier effect, an embodiment of the invention advantageously increases the reliability of an NMOS transistor, such as an N type LDMOS transistor. By reducing the substrate current, the reliability of the NMOS transistor, such as an N type LDMOS transistor is also advantageously increased. In such embodiment, drift region 214, which is an N type drift region, and drain region 252, which is an N type drain region, do not comprise silicon germanium.

In an embodiment in which MOS transistor 254 is a PMOS transistor, such as a P type LDMOS transistor, and source region 246 comprises silicon carbide, heterojunction 248, which is formed between source region 246 and well 208, provides similar advantages as the embodiment of the invention in which MOS transistor 254 is an NMOS transistor, such as an N type LDMOS transistor as discussed above. Thus, in an embodiment in which MOS transistor 254 is a PMOS transistor, such as a P type LDMOS transistor and source region 246 comprises silicon carbide, heterojunction 248 facilitates injection of hot electrons into source region 256 so as to reduce substrate current and the hot carrier effect, thereby advantageously increasing the reliability the PMOS transistor, such as a P type LDMOS transistor. In such embodiment, drift region 214 and drain region 252, which are both P type regions, do not comprise silicon carbide.

In an embodiment in which MOS transistor 254 is an NMOS transistor, such as an N type LDMOS transistor, and source region 246 comprises silicon carbide, heterojunction 248, which is formed between source region 246 and well 208, provides similar advantages as the embodiment of the invention in which MOS transistor 254 is a PMOS transistor, such as a P type LDMOS transistor, and source region 246 comprises silicon germanium. Thus, in an embodiment in which MOS transistor 254 is an NMOS transistor, such as an N type LDMOS transistor, and source region 246 comprises silicon carbide, heterojunction 248, which is formed between source region 246 and well 208, provides an increased barrier between source region 246 and channel 256. As a result, breakdown voltage is increased so as to advantageously improve punchthrough between source region 246 and drift region 214. Also, silicon carbide in source region 246 can induce tensile strain in channel 256, thereby increasing carrier mobility (i.e. electron mobility) and, consequently, advantageously reducing the on-resistance (Rdson) of MOS transistor 254. In such embodiment, drift region 214 and drain region 252, which are N type regions, do not comprise silicon carbide.

For 45 nanometer (nm) and smaller dimension process technologies, such as 32 nm or 28 nm process technologies, an embodiment of the invention's MOS transistor, such as an LDMOS transistor, can be compatible with a CMOS process without requiring additional processes and masks. The invention's MOS transistor, such as an LDMOS transistor, can also be applied to process technologies greater than 45 nm. However, for process technologies greater than 45 nm, the invention's transistor would require additional processes and masks.

Thus, as discussed above, by utilizing silicon germanium in the source region of a PMOS transistor, such as a P type LDMOS transistor, or by utilizing silicon carbide in the source region of an NMOS transistor, such as an N type LDMOS transistor, respective embodiments of the invention can provide a transistor, such as an LDMOS transistor, having a higher barrier between the source region and the channel, thereby advantageously increasing breakdown voltage so as to improve punchthrough between the source and drift regions of the transistor and also advantageously reducing the transistor's on-resistance (Rsdon).

Also, by utilizing silicon germanium in the source region of an NMOS transistor, such as an N type LDMOS transistor, or by utilizing silicon carbide in the source region of a PMOS transistor, such as a P type LDMOS transistor, respective embodiments of the invention can provide a transistor, such as an LDMOS transistor, having reduced substrate current and reduced hot carrier effect, thereby advantageously providing a transistor, such as an LDMOS transistor, having increased reliability.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A method for fabricating a MOS transistor, said method comprising:
    forming a gate stack over a well;
    forming a recess in said well adjacent to a first sidewall of said gate stack;
    forming a source region in said recess such that a heterojunction is formed between said source region and said well;
    forming a drain region spaced apart from a second sidewall of said gate stack, said drain region formed from a drift region so as not to form a semiconductor heterojunction with said drift region.

2. The method of claim 1, wherein said source region comprises silicon germanium and said well comprises silicon.

3. The method of claim 1, wherein said source region comprises silicon carbide and said well comprise silicon.

4. The method of claim 1, wherein said drift region comprises a lightly doped drift region, and wherein forming said drain region from said drift region comprises implanting dopants into said lightly doped drift region.

5. The method of claim 4, wherein said drain region is separated from said second side of said gate stack by an isolation region.

6. The method of claim 4, wherein a channel is formed between said source region and said lightly doped drift region.

7. The method of claim 1, wherein said source region is heavily doped in situ.

8. The method of claim 1, wherein said source region is heavily doped by utilizing an implantation process.

9. The method of claim 1, wherein said MOS transistor is an N type LDMOS transistor.

10. The method of claim 1, wherein said MOS transistor is a P type LDMOS transistor.

11. A MOS transistor comprising:
    a gate stack overlying a well;
    a source region situated adjacent to a first sidewall of said gate stack;
    a drain region spaced apart from a second sidewall of said gate stack;
    said source region comprising a different semiconductor material than said well so as to cause a heterojunction to form between said well and said source region, and said drain region comprising a same semiconductor material as a drift region so as not to form a semiconductor heterojunction with said drift region.

12. The MOS transistor of claim 11, wherein said source region comprises silicon germanium and said well comprises silicon.

13. The MOS transistor of claim 11, wherein said source region comprises silicon carbide and said well comprises silicon.

14. The MOS transistor of claim 11 further comprising an isolation region separating said drain region from said second side of said gate.

15. The MOS transistor of claim 11 further comprising a channel situated between said source region and said drift region, which is lightly doped.

16. The MOS transistor of claim 15, wherein said gate stack overlies said channel and said lightly doped drift region.

17. The MOS transistor of claim 11 further comprising an inner spacer situated adjacent to each of said first and second sidewalls of said gate stack.

18. The MOS transistor of claim 17 further comprising an outer spacer situated adjacent to said inner spacer.

19. The MOS transistor of claim 11, wherein said MOS transistor is an N type LDMOS transistor.

20. The MOS transistor of claim 11, wherein said MOS transistor is a P type LDMOS transistor.

* * * * *